United States Patent [19]
Kabaya et al.
[11] 3,770,520
[45] Nov. 6, 1973

[54] PRODUCTION OF SEMICONDUCTOR INTEGRATED-CIRCUIT DEVICES

[75] Inventors: Yoshihiko Kabaya; Heishichi Ikeda, both of Kanagawa-ken, Japan

[73] Assignee: Kabushiki Kaisha Kyodo Denshi Gijutsu Kenkyusho, Sagamihara-shi, Kanagawa-ken, Japan

[22] Filed: June 23, 1969

[21] Appl. No.: 835,356

[30] Foreign Application Priority Data
June 26, 1968 Japan ................................ 43/44299

[52] U.S. Cl. ...................... 148/175, 29/576, 29/580, 117/106 A, 117/201, 117/212, 117/213, 148/174, 148/187, 148/189, 317/235 R, 317/234;235
[51] Int. Cl. ..... H01l 7/36, H01l 11/00, C23c 13/00
[58] Field of Search ..................... 148/1.5, 1.6, 174, 148/175, 187, 189, 33.2; 117/106, 107.2, 201, 212, 213; 27/576, 580, 317/234, 235

[56] References Cited
UNITED STATES PATENTS

| | | | |
|---|---|---|---|
| 3,514,676 | 5/1970 | Fa | 317/235 |
| 3,607,466 | 9/1971 | Miyazaki | 148/175 |
| 3,617,826 | 11/1971 | Kobayashi | 317/235 R |
| 3,260,902 | 7/1966 | Porter | 317/235 |
| 3,396,456 | 8/1968 | Weinstein | 29/580 |
| 3,475,661 | 10/1969 | Iwata et al. | 317/234 |

OTHER PUBLICATIONS

Boss et al. "Simultaneous Diffusion Process into Polycrystalline and Monocrystalline Silicon" IBM Tech. Discl. Bul. Vol. 10, No. 2, July 1967 p. 164–165.

Sony Corp. "Monolithic IC Puts Out 18 Watts" Electronics, March 17, 1969, pp. 185–186.

*Primary Examiner*—L. Dewayne Rutledge
*Assistant Examiner*—W. G. Saba
*Attorney*—Robert E. Burns and Emmanuel J. Lobato

[57] ABSTRACT

A semiconductor integrated-circuit device in which, on a semiconductor substrate of a first conductivity type, a number of semiconductor regions of a conductivity type different from the first conductivity type are disposed and are surrounded around their side surfaces by polycrystalline layers within which is diffused an impurity imparting a conductivity different from that of the semiconductor regions, whereby the difference in diffusion velocities of impurities in single crystals and in polycrystalline structures is utilized

2 Claims, 5 Drawing Figures

PRODUCTION OF SEMICONDUCTOR INTEGRATED-CIRCUIT DEVICES

BACKGROUND OF THE INVENTION

This invention relates generally to semiconductor devices and techniques used in the production thereof and more particularly to isolation techniques used in manufacturing semiconductor intergrated-circuit devices.

In a single-crystal semiconductor integrated-circuit device of general type known heretofore, an n-type semiconductor layer is grown by the epitaxial crystal growth method on a p-type semiconductor substrate, and then, from the outer surface of the epitaxial layer, a p-type ring-shaped diffused layer reaching the p-type substrate is formed (isolation diffusion) by the selective diffusion technique, a region of the n-type semiconductor is surrounded on its side and lower surfaces by the p-type semiconductor substrate being left within the ring-shaped p-type diffused layer, and components such as transistors, diodes, resistors, and capacitors are provided within this region.

In such a known device, however, a p-type diffused layer of high concentration is formed at the time of isolation diffusion, whereby the breakdown voltage of the pn junction for isolaton is low. Furthermore, the isolation diffusion process requires a time of from a few hours to more than ten hours, whereby the work efficiency of the process is extremely poor.

In addition, known devices of the above described character have been accompanied by numerous problems relating to the production thereof, one example being the difficulty of obtaining uniformity in the thickness of the epitaxial layer, whereby it has been necessary to adjust the isolation process time with respect to one and the same semiconductor wafer.

SUMMARY OF THE INVENTION

It is an object of the present invention to provide semiconductor integrated-circuit devices which are not accompanied by the above described difficulties.

Another object of the invention is to provide a method for producing semiconductor integrated-circuit devices according to the invention.

We have found that these objects as well as other objects as will presently become apparent can be achieved in accordance with a method wherein the fundamental principle is the utilization in the isolation process of the difference in diffusion velocities of impurities in single crystals and those in multiple crystal or polycrystalline structures.

According to the present invention, briefly summarized, there is provided a semiconductor integrated-circuit device in which, on a semiconductor substrate of a first conductivity type, there are disposed a plurality of semiconductor regions of a conductivity type differing from that of the substrate surrounded around the side surfaces thereof by polycrystalline layers within which is diffused an impurity imparting the same conductivity type as that of the substrate, and semiconductor electronic components such as diodes, transistors, resistors, and/or capacitors are formed in these semiconductor regions.

According to the present invention there is also provided a method for producing the above described semiconductor integrated-circuit device, which method is characterized by a step in which an impurity of a conductivity differing from that of the semiconductor regions is caused to diffuse in the polycrystalline layers.

The nature, principle, details, and utility of the invention will be more clearly apparent from the following detailed description with respect to preferred embodiments of the invention illustrated in the accompanying drawing, in which drawing like parts are designated by like reference numerals and characters.

DETAILED DESCRIPTION

Figure 1:
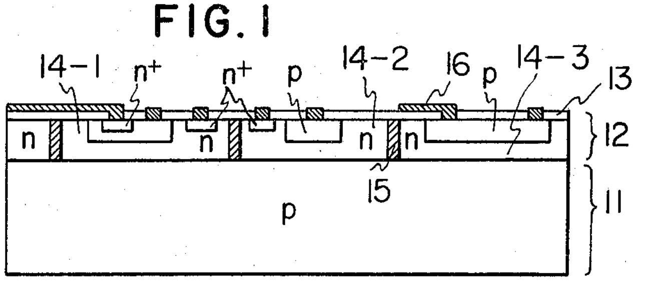
FIG. 1 is a sectional view showing one example of a semiconductor device constituting a preferred embodiment of the invention.

Referring to FIG. 1, the example shown therein of a semiconductor integrated-circuit device according to the invention has a p-type, single-crystal semiconductor substrate 11, a vapor-phase grown layer 12 formed on the substrate, and an insulating, protective film layer 13 made of a material such as silicon dioxide and covering the outer surface (upper surface as viewed in FIG. 1) of the layer 12.

Within the vapor-phase grown layer 12, regions 14-1, 14-2, and 14-3 are n-type, vapor-phase grown layers with polycrystalline semiconductor layers 15 interposed there-between.

Within the n-type, vapor-phase grown layers, which have side surfaces surrounded by polycrystalline layers and bottom surfaces in contact with the p-type substrate 11, electric elements or components are formed. For example, a transistor is formed in region 14-1, a diode is formed in region 14-2, and a resistance component is formed in region 14-3. Furthermore, electrodes 16 are formed on these elements to establish desired connections there-between.

An important feature of the device of the above described organization is that the n-type, vapor-phase grown layers 14-1, 14-2, and 14-3 in which the various components are contained are electrically separated respectively by pn junctions between their bottom surfaces and the p-type substrate and by pn junctions between their side surfaces and the p-type polycrystalline layers 15 surrounding them.

A semiconductor integrated-circuit device as described above with respect to one example thereof is fabricated in accordance with the present invention by a method as illustrated by the following example of process and as indicated in FIGS. 2(A) through 2(D).

Figure 2A:
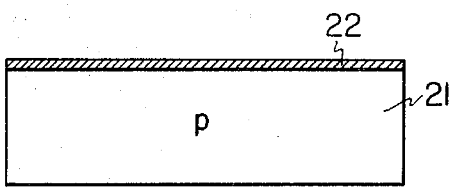
FIGS. 2(A) through 2(D), inclusive, are sectional views indicating steps in a specific example of practice of the method according to the invention.
Figure 2B:
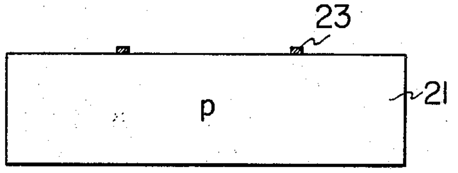

First, on a p-type silicon substrate 21 of a resistivity of 8 ohm. cm., a silicon dioxide film 22 of a thickness of approximately 5,000 angstroms is formed by thermal oxidation, as indicated in FIG. 2(A). Next, by a photo-etching technique, only one part 23 of annular shape of the silicon dioxide film 22 is left, the remainder of the film being removed, as indicated in FIG. 2(B).

Figure 2C:
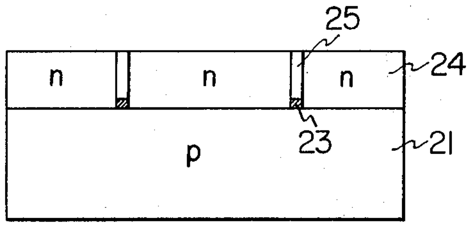

Then, on the surface of the p-type silicon substrate 21 on which the silicon dioxide film has been thus left in annular form 23, an n-type vapor-phase grown layer of a resistivity of approximately 0.6 ohm. cm. and a thickness of 7 microns is formed, as indicated in FIG. 2(C). During this step an n-type single-crystal layer 24 is formed by epitaxial growth on the exposed surface parts of the p-type silicon substrate, while a polycrystalline silicon region or layer 25 of a resistivity of approximately 10 ohm. cm. grows on and above the silicon dioxide film 23 of annular shape.

Figure 2D:
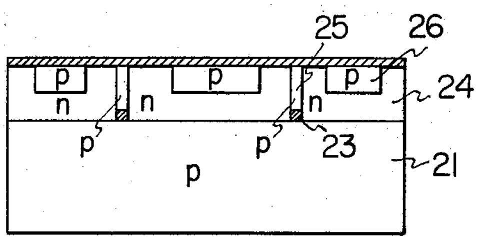

A p-type impurity, for example, boron, is then caused to diffuse at a temperature of 1,200° C for approximately 40 minutes into the single-crystal and polycrystalline layers, as indicated in FIG. 2(D).

An important feature of this process is that, since the boron diffuses within the polycrystalline layer at a velocity which is approximately from 2.5 to 3, times that at which it diffuses within the single-crystal layer, isolation diffusion reaching the p-type substrate 21 has already been completed in the polycrystalline layer by the time at which a p-type diffused layer 26 is formed to about one half of the depth (approximately 3 microns) of the single-crystal layer.

Accordingly, by the practice of the present invention, p-type diffused layers 26 of components such as diodes, resistances, and transistors are formed simultaneously with the isolation diffusion. Therefore, an isolation process step, as has been necessary heretofore can be omitted, whereby the manufacturing efficiency is remarkably increased.

We have found, furthermore, that the breakdown voltage of the pn junction between the single-crystal and polycrystalline layers in actual instances of practice is approximately 45 volts, which indicates an excellent insulative characteristic of a degree which could not be attained by the isolation method depending on pn junctions as practiced heretofore.

For comparison, the breakdown voltage of a pn junction for isolation which has been formed by a known method, that is by using a p-type substrate of the same resistivity as that in the above described example, forming an epitaxial layer of the same thickness, and using boron as a p-type impurity, is approximately 25 volts.

While the invention has been described above with respect to only examples of preferred embodiments thereof, it is intended to cover all changes and modifications of the examples herein chosen for the purposes of disclosure, which do not constitute departures from the spirit and scope of the invention. For example, an acceptor impurity can be caused to adhere to the above described silicon dioxide surface prior to the formation of the epitaxial layer thereby to improve further the insulative characteristic, or an $n^+$ diffused layer can be formed beforehand, prior to the formation of the epitaxial layer, on the parts from which the silicon dioxide has been removed and used as a buried layer.

Furthermore, various other innovations are also possible and effective. For example, a substance such as silicon monoxide, silicon nitride, glass consisting of 96 percent silicic acid and having a softening point of approximately 1,000°C, and metals such as molybdenum, tungsten, etc., which inhibit the growth of single crystals can be used instead of silicon dioxide, or the surface of the silicon substrate can be roughened with a diamond point and thereby changed in texture.

Examples of forming a polycrystalline silicon layer are as follows.

An $SiO_2$ film is first provided on a p-type silicon semiconductor substrate, and portions of the silicon dioxide film are etched away from the substrate surface to leave the film only at the substrate positions where the isolating layer of the present invention is to be provided.

Next, the substrate is heat-treated for 30 seconds at an initial heating temperature of 1,200°C, and subsequently heated for 3 minutes at a reduced temperature of 1,000° in an atmosphere of hydrogen and $SiCl_4$ to grow the polycrystalline silicon from the vapour phase, whereby the desired monocrystalline silicon layer of about 0.5 micron thick is formed on the silicon substrate surface which is free of $SiO_2$.

In another example silicon is deposited over a substrate surface coated with silicon oxide deposited thereon by evaporation on an entire surface of the substrate and treated by electron beam. The layer deposited has a thickness of about 0.1 micron, thereafter the entire combination is immersed in a hydrogen fluoride (HF) solution to remove the deposited silicon on the $SiO_2$ layer together with some $SiO_2$, so that the polycrystalline silicon layer alone is left at a required portion.

In this case, it is also possible to vapor deposit the polycrystalline silicon layer over the entire surface of the substrate from a vapour phase, so that unnecessary portions can be etch-removed by a solution of nitric acid and fluoric acid.

We claim:

1. A method of producing a semiconductor integratd circuit device comprising the steps of: providing a single crystal semiconductor substrate of a first conductivity type, forming on a whole major surface of said substrate a first layer consisting of a member selected from the group consisting of $SiO_2$, $Si_3N_4$, glass consisting of 96 percent silicic acid and having a softening point of approximately 1,000°c, molybdenum, and tungsten which inhibit the growth of a single crystal; photoetching the first layer to remove parts thereof and retaining remaining parts surrounding areas of the surface of the first layer from which said parts of the first layer have been removed, forming on said whole major surface a semiconductor second layer of a second conductivity type by vapor-phase growing, whereby growth of a single-crystal epitaxial layer on the areas of said major surface where said first layer is removed and growth of a poly-crystal layer on said remaining parts of said second layer are simultaneously attained so that the single-crystal epitaxial layer is surrounded and isolated by said polycrystal area, forming an insulating film over the whole surface of said vapor-phase grown layer; removing by photo-etching said insulating layer on the surface of said polycrystal layer and on regions of the surface of said single-crystal epitaxial growth layer, diffusing an impurity imparting said first conductivity type to regions where said insulating film has been removed, thereby to form isolation diffused regions extending to the substrate from the surface of said polycrystal layer and diffused regions located completely within said single-crystal epitaxial growth layer and having said first conductivity type and terminating above the major surface of the substrate, forming electrodes connected to all said diffused regions of said first conductivity type and forming current paths to said electrodes by means of a conductive film, and prior to forming said semiconductor second layer an impurity forming the same conductivity type as the first conductivity type is adhered to the surface of said first layer.

2. A method according to claim 1, in which said impurity imparting said first conductivity type to said polycrystal layer is diffused therein at the same time as said diffused regions and the diffusion velocity is greater in said polycrystal layer thereby isolating the single-crystal areas of said single-crystal layer.

* * * * *